United States Patent
Grill et al.

[11] Patent Number: 6,140,226
[45] Date of Patent: Oct. 31, 2000

[54] DUAL DAMASCENE PROCESSING FOR SEMICONDUCTOR CHIP INTERCONNECTS

[75] Inventors: Alfred Grill, White Plains; John Patrick Hummel, Millbrook; Christopher Vincent Jahnes, Monsey; Vishnubhai Vitthalbhai Patel, Yorktown Heights; Katherine Lynn Saenger, Ossining, all of N.Y.

[73] Assignee: International Business Machines Corporation, Armonk, N.Y.

[21] Appl. No.: 09/126,212

[22] Filed: Jul. 30, 1998

Related U.S. Application Data

[60] Provisional application No. 60/071,628, Jan. 16, 1998.

[51] Int. Cl.⁷ .............................................. H01L 21/4763
[52] U.S. Cl. ........................ 438/637; 438/701; 438/638
[58] Field of Search .................................. 438/637, 636, 438/700, 701, 702, 638, 640

[56] References Cited

U.S. PATENT DOCUMENTS 5,604,156  2/1997  Chung et al. .
5,882,996  3/1999  Dai ........................................ 438/597

FOREIGN PATENT DOCUMENTS

905768  3/1999  European Pat. Off. .

*Primary Examiner*—Caridad Everhart
*Attorney, Agent, or Firm*—Robert M. Trepp

[57] ABSTRACT

The present invention relates to lithographic methods for forming a dual relief pattern in a substrate, and the application of such methods to fabricating multilevel interconnect structures in semiconductor chips by a Dual Damascene process in which dual relief cavities formed in a dielectric are filled with conductive material to form the wiring and via levels. The invention comprises a twice patterned single mask layer Dual Damascene process modified by the addition of an easy-to-integrate sidewall liner to protect organic interlevel and intralevel dielectrics from potential damage induced by photoresist stripping steps during lithographic rework. The invention further comprises a method for forming a dual pattern hard mask which may be used to form dual relief cavities for use in Dual Damascene processing, said dual pattern hard mask comprising a first set of one or more layers with a first pattern, and a second set of one or more layers with a second pattern.

48 Claims, 8 Drawing Sheets

PRIOR ART

DUAL DAMASCENE PROCESSING FOR SEMICONDUCTOR CHIP INTERCONNECTS

CROSS-REFERENCE TO RELATED APPLICATION

The present application claims priority to co-pending U.S. provisional application Ser. No. 60/071,628 filed Jan. 16, 1998.

FIELD OF THE INVENTION

The present invention relates to lithographic methods for forming a dual relief pattern in a substrate, and the application of such methods to fabricating multilevel interconnect structures in semiconductor chips.

BACKGROUND OF THE INVENTION

Device interconnections in Very Large Scale Integrated (VLSI) or Ultra-Large Scale Integrated (ULSI) semiconductor chips are typically effected by multilevel interconnect structures containing patterns of metal wiring layers called traces. Wiring structures within a given trace or level of wiring are separated by an intralevel dielectric, while the individual wiring levels are separated from each other by layers of an interlevel dielectric. Conductive vias are formed in the interlevel dielectric to provide interlevel contacts between the wiring traces.

By means of their effects on signal propagation delays, the materials and layout of these interconnect structures can substantially impact chip speed, and thus chip performance. Signal propagation delays are due to RC time constants wherein R is the resistance of the on-chip wiring, and C is the effective capacitance between the signal lines and the surrounding conductors in the multilevel interconnection stack. RC time constants are reduced by lowering the specific resistance of the wiring material, and by using interlevel and intralevel dielectrics with lower dielectric constants.

A preferred metal/dielectric combination for low RC interconnect structures might be Cu metal with a carbon-based dielectric such as diamond-like-carbon (DLC) or an organic polymer. Due to difficulties in subtractively patterning copper, however, interconnect structures containing copper are typically fabricated by a Damascene process. In a Damascene process, metal patterns inset in a layer of dielectric are formed by the steps of

- etching holes (for vias) or trenches (for wiring) into the interlevel or intralevel dielectric,
- optionally lining the holes or trenches with one or more adhesion or diffusion barrier layers,
- overfilling said holes and trenches with a conductive wiring material, by a process such as physical vapor deposition (for example, sputtering or evaporation), chemical vapor deposition, or plating, and
- removing the metal overfill by planarizing the metal to be even with the upper surface of the dielectric.

This process is repeated until the desired number of wiring and via levels have been fabricated.

Fabrication of interconnect structures by Damascene processing can be substantially simplified by using a process variation known as Dual Damascene, in which a wiring level and its underlying via level are filled in with metal in the same deposition step. However, fabrication by this route requires transferring two patterns to one or more layers of dielectric in a single block of lithography and/or etching steps. This has previously been accomplished by using a layer of masking material that is patterned twice, the first time with a via pattern and the second time with a wiring pattern. This procedure typically comprises the steps of:

- forming one or more layers of dielectric having a total thickness equal to the sum of the via level and wiring level thicknesses,
- applying a layer of a hard mask material such as $SiO_2$ or $Si_3N_4$ having different etch characteristics than the underlying dielectric,
- patterning the hard mask material with the via level pattern, typically by etching through a photoresist stencil,
- transferring said via level pattern into a first upper thickness of said one or more layers of dielectric by a process such as etching,
- repatterning the same layer of hard mask material with the wiring level pattern,
- transferring the wiring level pattern into a second upper thickness of said one or more layers of dielectric in such a manner as to simultaneously transfer the previously etched via pattern to a bottom thickness of said one or more layers of dielectric, said second upper and bottom thicknesses closely approximating the wiring and via level thicknesses, respectively.

While this "twice patterned single mask layer" process has the virtue of simplicity, difficulties in reworking the second lithography step may occur if the interconnect dielectric and the photoresist stencil used to pattern the hard mask have similar etch characteristics. Such would be the case with an organic photoresist and a carbon-based interconnect dielectric such as DLC. A typical cause for rework might be a misalignment between the via-patterned hard mask/upper dielectric layers and the wiring-patterned resist layer. However, lithographic rework at this stage is a problem because the sidewalls of the via-patterned dielectric are not protected from the resist stripping steps necessary for removing a misaligned wiring-patterned resist layer.

SUMMARY OF THE INVENTION

The present invention relates to improved methods for defining and transferring two patterns (or a single dual relief pattern) to one or more layers of dielectric in a single block of lithography and/or etching steps. The invention comprises two preferred modifications of a prior art "twice patterned single mask layer" Dual Damascene process and two preferred embodiments of a fabrication process for a dual pattern hard mask which may be used to form dual relief cavities for Dual Damascene applications.

The first and second preferred modifications of a prior art "twice patterned single mask layer" process introduce an easy-to-integrate sidewall liner which protects organic interlevel and intralevel dielectrics from potential damage induced by photoresist stripping steps which may be needed, for example, during rework processing to correct for lithographic misalignment. In the first modification, the liner may be permanent, in which case portions of the liner can remain in the final structure. In the second modification, the liner may be disposable, in which case the liner would be removed from the finished structure. Use of these inventive modifications allows problem-free rework with minimal impact on processing.

The two preferred embodiments of a dual pattern hard mask fabrication process provide a mask wherein the lithographic alignment for both via and wiring levels is completed before any pattern transfer into the underlying interlevel/intralevel dielectric. The dual pattern hard mask might preferably comprise a bottom layer of silicon nitride with a first pattern and a top layer of SiO2 with a second pattern. The two embodiments differ by the order in which said first and second patterns are transferred into the hard mask layers.

It is thus an object of the present invention to improve the existing "twice patterned single mask layer" Dual Damascene process by adding a protective sidewall liner which may or may not remain in the final structure.

It is a further object of the present invention to teach the use of a Dual Damascene process in which a dual pattern hard mask containing both via and wiring level patterns is fabricated on a substrate comprising at least one layer of an interlevel/intralevel dielectric, prior to any pattern transfer into the interlevel/intralevel dielectric.

It is a further object of the present invention to provide a general method for forming a dual pattern hard mask, said dual pattern hard mask comprising a first set of one or more layers with a first pattern, and a second set of one or more layers with a second pattern.

It is a further object of the present invention to teach a method for transferring said first and second patterns of said dual pattern hard mask to an underlying substrate to form a dual relief patterned structure.

BRIEF DESCRIPTION OF THE DRAWINGS

These and other features, objects, and advantages of the present invention will become apparent upon a consideration of the following detailed description of the invention when read in conjunction with the drawings, in which:

FIGS. 8A–8D illustrate in cross section view a three pattern hard mask, and some associated materials issues.

DESCRIPTION OF THE PREFERRED EMBODIMENTS

FIGS. 1A–1L show in cross section view a prior art "twice patterned single mask layer" Dual Damascene process flow for forming a wiring layer and its underlying via layer. The process flow may be exercised on a variety of substrates but is illustrated for the simplified substrate of FIG. 1A which comprises a semiconductor base 2 containing arrays of electrical devices (not shown), conductive via 4, and dielectric passivation layer 6.

Figure 1A:
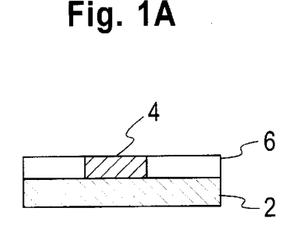
FIGS. 1A–1L show in cross section view the prior art "twice patterned single mask layer" Dual Damascene process flow for forming a wiring layer and its associated underlying via layer.
Figure 1B:
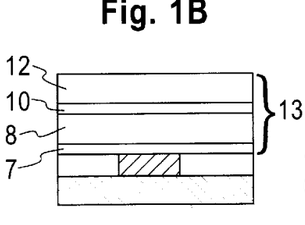

A layered dielectric stack 13 comprising an optional dielectric passivation/adhesion layer 7, a via level dielectric 8, an optional dielectric etch stop layer 10, and a wiring level dielectric 12 are then applied to produce the structure of FIG. 1B. Via and wiring dielectrics 8 and 12 might be carbon-based materials such as DLC or fluorinated DLC (FDLC), SiCO or SiCOH compounds, or organic or inorganic polymer dielectrics, and optional dielectric etch stop 10 might be a silicon-containing material such as SiO2, Si3N4, SiOxNy, SiCOH compounds, silicon-containing DLC (SiDLC), etc. The total thickness of layered dielectric stack 13 closely approximates the sum of the via and wiring level thicknesses.

For a description of DLC and SiDLC, reference is made to U.S. Pat. No. 5,559,367 which is incorporated here by reference, for a description of FDLC reference is made to U.S. Pat. Nos. 5,462,784 and 5,674,638 which is incorporated herein by reference. For a description of hydrogenated oxidized silicon carbon material (SiCOH) and a method for making layers thereof reference is made to U.S. Pat. Ser. No. 09/107,567 filed Jun. 29, 1998 by A. Grill et al entitled "Hydrogenated Oxidized Silicon Carbon Material" which is incorporated herein by reference.

Figure 1C:
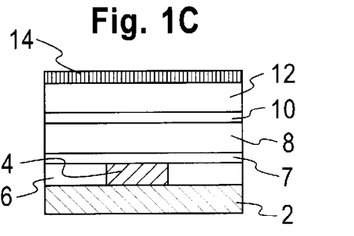
Figure 1D:
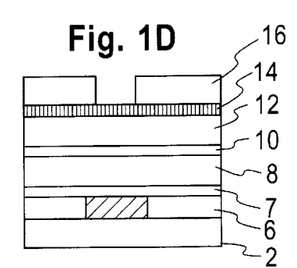
Figure 1E:
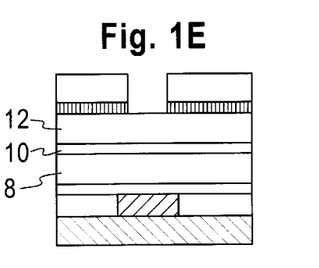
Figure 1F:
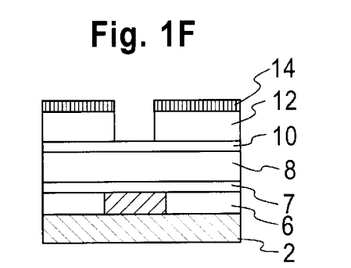

A hard mask layer 14, formed from a material such as SiO2 or Si3N4 having different etch characteristics from the underlying dielectric 12, is then applied to produce the structure of FIG. 1C. Hard mask layer 14 is more resistant than photoresist to the etching condidtions used for transfering the photoresist pattern into underlying dielectric 12. A photoresist forms a soft mask and is mainly composed of organic material. The hard mask may be composed of inorganic materials. A resist layer 16 patterned with a first pattern is then formed on hard mask 14, as shown in FIG. 1D. The first pattern in patterned resist layer 16 would typically be a via level pattern. If resist layer 16 is for some reason misaligned with respect to underlying structures such as via 4, resist layer 16 may be removed by a process such as ashing or wet chemical etching without damaging underlying dielectric 12, since dielectric 12 is still protected by hard mask 14. Resist 16 is then reapplied and patterned until the desired alignment is achieved. Hard mask layer 14 is then patterned with said first pattern by etching through the openings in patterned resist layer 16, as shown in FIG. 1E. Said first pattern is then transferred into the entire thickness of dielectric 12 by an etching process such as reactive ion etching (RIE), as shown in FIG. 1F. This etching process typically also removes all residuals of patterned resist layer 16.

Figure 1G:
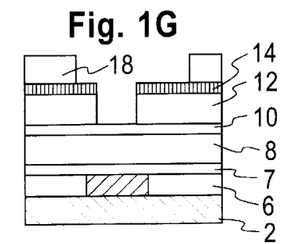
Figure 1H:
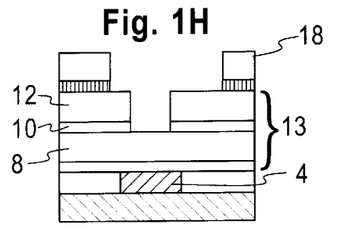
Figure 1I:
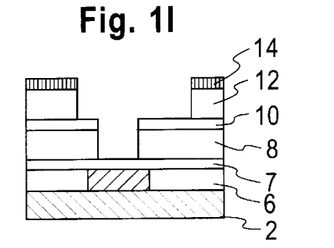

A resist layer 18 patterned with a second pattern is then formed on the structure of FIG. 1F to produce the structure of FIG. 1G. Said second pattern in patterned resist layer 18 would typically be a wiring level pattern. Hard mask layer 14 is then patterned with said second pattern by etching through the openings in patterned resist layer 18, as shown in FIG. 1H. Exposed regions of optional dielectric etch stop 10 would typically also be removed during this etching step, as well. Dielectrics 8 and 12 are then etched to transfer the second pattern into the entire thickness of dielectric 12, and the first pattern into the entire thickness of dielectric 8, as shown in FIG. 1I. This etching process typically also removes all residuals of patterned resist layer 18. Exposed regions of optional dielectrics 10 and 7 are then removed to produce the structure of FIG. 1J containing dual relief cavity 20. Cavity 20 is optionally lined with one or more adhesion or diffusion barrier layers (not shown) and then overfilled with conductive wiring material 22, by a process such as physical vapor deposition, chemical vapor deposition, solution deposition, or plating to produce the structure of FIG. 1K. Conductive wiring material 22 is then planarized by a process such as chemical mechanical polishing (CMP) to be approximately even with the top surface of dielectric 12 and/or remaining hard mask 14. Remaining hard mask 14 is then optionally removed to produce the structure of FIG. 1L. Additional wiring/via levels may be fabricated by repeating the steps shown in FIGS. 1B–1L.

Figure 1J:
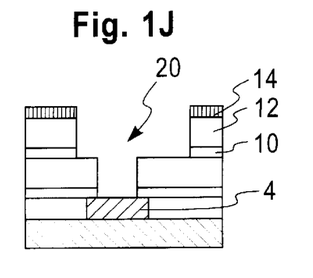
Figure 1K:
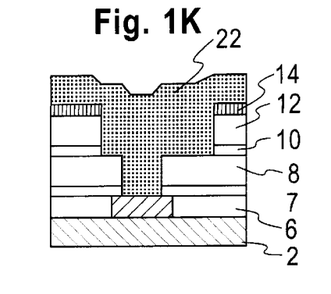
Figure 1L:
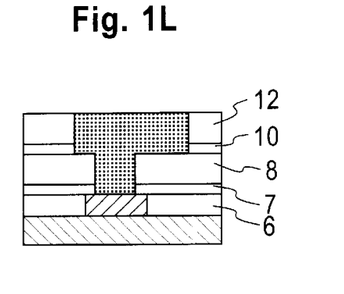
Figure 2A:
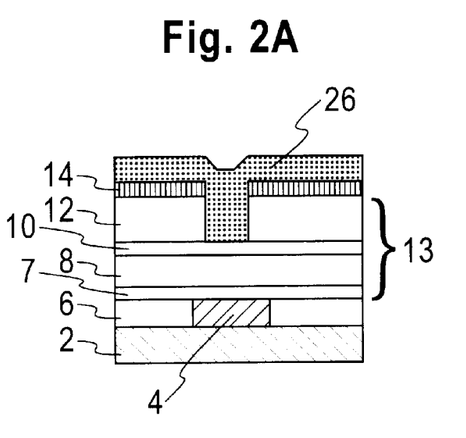
FIGS. 2A–2D show in cross section view an exaggeration of the rework problem that may be encountered with the process flow of FIG. 1.
Figure 2B:
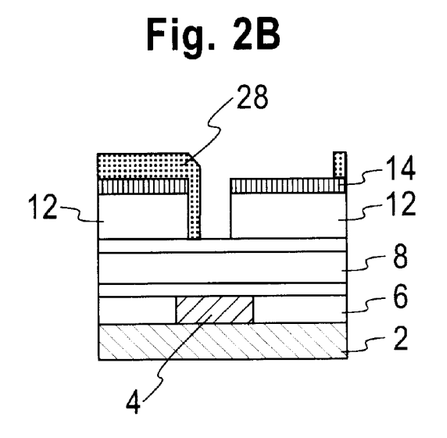
Figure 2C:
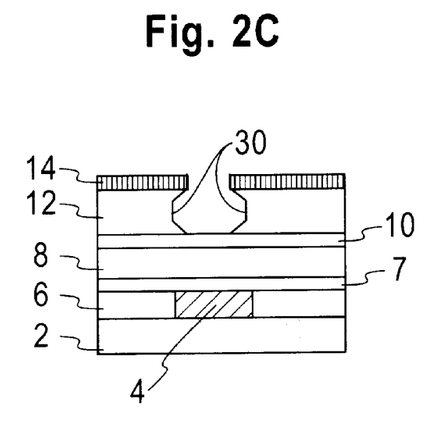
Figure 2D:
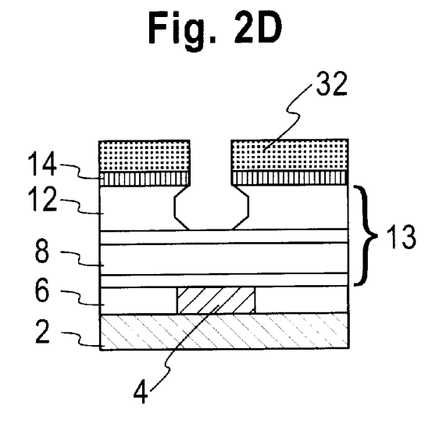

FIGS. 2A–2D show in cross section view an exaggeration of the rework problem that may be encountered with the process flow of FIGS. 1B–1L if resist 18 of FIG. 1G is misaligned. FIG. 2A shows the structure of FIG. 1F after application of resist 26. FIG. 2B shows the structure of FIG. 2A after resist layer 26 has been patterned with said second pattern to produce misaligned patterned resist layer 28. FIG. 2C shows the structure of FIG. 2B after removal of misaligned patterned resist layer 28 by a process such as ashing or wet chemical etching. Sidewalls 30 of dielectric 12 are clearly undercut. Such a result may not be a problem when the dimensions of said second pattern substantially exceed the dimensions of the first pattern, since the undercut regions would be etched anyway. However, it will be a problem for cases in which the dimensions of the first and second patterns are similar, as shown in FIG. 2D, since the undercut sidewall profile will persist in the final structure. Such undercutting makes critical dimension (CD) control more difficult and produces cavities that are more difficult to line with a conductive liner and fill with a conductive wiring material 22. An additional problem encountered with this technique is that resist layer 26 is necessarily thicker over the via areas. For positive-tone resist systems, this thicker resist will require higher dose exposures, with consequent loss in CD control.

FIGS. 3A–3G show a first preferred modification of the FIGS. 1A–1L, "twice patterned single mask layer" process described above, in cross section view. The process of FIGS. 3A–3G differs from that of FIGS. 1A–1L by the addition of a sidewall liner which may remain in the final structure. In addition, the first and second patterns to be transferred are the wiring and via patterns in the process of FIGS. 3A–3G, as opposed to the via and wiring patterns in the process of FIGS. 1A–1L.

Figure 3A:
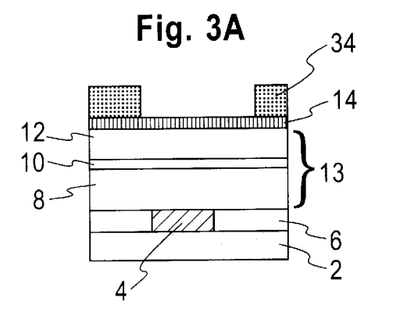
FIGS. 3A–3G show in cross section view a first preferred modification of the FIG. 1 process.
Figure 3B:
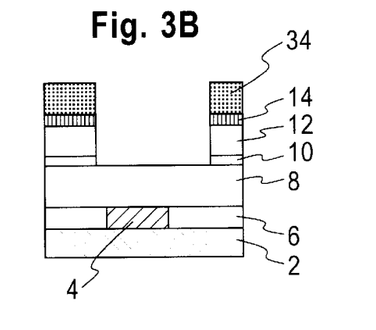
Figure 3C:
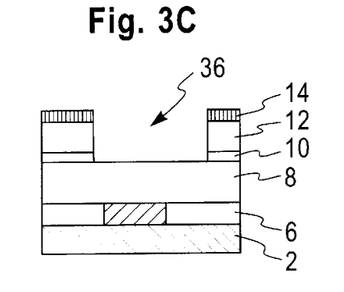

FIG. 3A shows the structure of FIG. 1C after application of an overlayer of resist 34 analogous to resist layer 16, but patterned with a wiring level pattern. Hard mask layer 14 is then patterned with the wiring pattern of resist layer 34, to produce the structure of FIG. 3B. The wiring pattern of resist layer 34 is then transferred to dielectric layer 12, and preferably to dielectric etch stop layer 10 as well, to form cavity 36 in FIG. 3C. A thin layer of conductive or insulating liner material 38 that may also be used as a hard mask is then conformally deposited over the topography of FIG. 3C to form the lined cavity 40 shown in FIG. 3D. Possible hard mask/liner materials for hard mask/liner material 38 include conductive materials such as the metals W, Ta, Ti, Zr, Cr, Hf, the metal nitrides WN, TaN, TiN, ZrN, HfN, and metal silicon nitrides such as TaSiN, TiSiN, ZrSiN, and HfSiN, semiconductors such as amorphous hydrogenated silicon (a-Si:H), and insulators such as SiO2, Si3N4, and SiCOH compounds. Hard mask/liner material 38 is preferably conducting if any of it is to be left in the final structure.

Figure 3D:
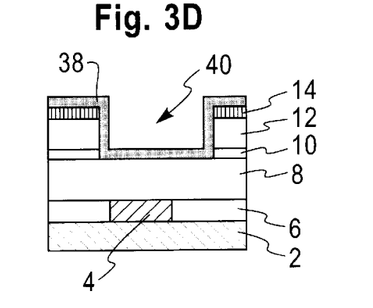
Figure 3E:
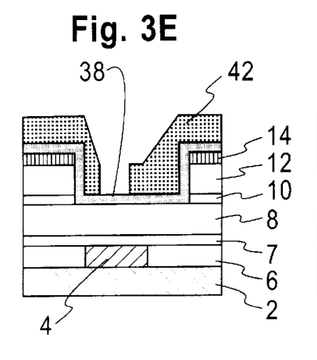
Figure 3F:
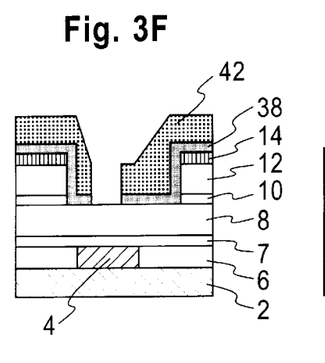
Figure 3G:
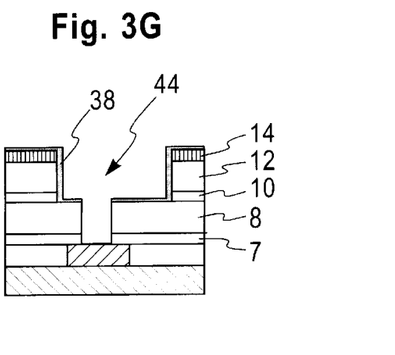

FIG. 3E shows the structure of FIG. 3D after application of an overlayer of resist 42 patterned with a via level pattern. In the event patterned resist 42 is misaligned, patterned resist 42 may be removed by a process such as ashing or wet chemical etching without damaging the sidewalls of dielectric layer 12 or the top surface of dielectric layer 8. The steps of applying an overlayer of resist 42 and patterning resist 42 may be repeated until patterned resist 42 is properly aligned. The pattern of resist layer 42 is then transferred to hard mask/liner layer 38, to produce the structure of FIG. 3F, and then transferred further to dielectric layers 8 and 7 to produce the dual relief cavity 44 in FIG. 3G. After optional removal (not shown) of some or all of patterned hard mask/liner 38 by a selective etching process such as CMP, RIE, or wet etching, the structure is overfilled with a conductive material and planarized, as shown in FIGS. 1K and 1L. Any portions of hard mask/liner 38 remaining above dielectric 12 after the final polishing step are preferably removed before fabrication of any overlying wiring or via levels.

FIGS. 4A–4F show a second preferred modification of the FIGS. 1A–1L. "twice patterned single mask layer" process, in cross section view. The process of FIGS. 4A–4F differs from that of FIGS. 1A–1L by the addition of a disposable sidewall coating which is removed from the structure at an intermediate stage in processing. However, it is similar to the prior art FIGS. 1A–1L process in that a single hard mask layer is patterned twice, first with a via pattern and then with a wiring pattern.

Figure 4A:
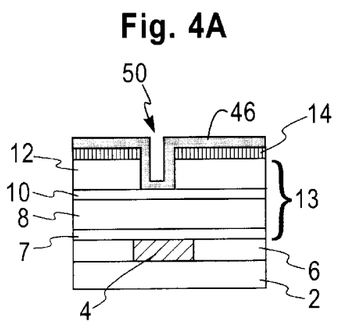
FIGS. 4A–4F show in cross section view a second preferred modification of the FIG. 1 process.
Figure 4B:
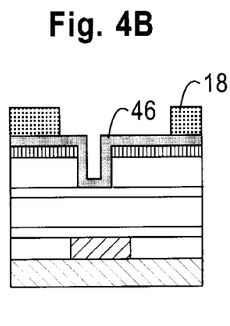

FIG. 4A shows the structure of FIG. 1F after application of thin disposable liner 46 conformally deposited over the topography of FIG. 1F to form lined cavity 50. Liner 46 may be conductive or insulating, and is preferably selected from the group of materials resistant to the oxygen ashing or wet chemical etching of the resist stripping process, and preferably has a thickness between 1 and 50 nm. Possible liner materials include conductive materials such as the metals W, Ta, and Cr, metal nitrides such as WN, TaN, TiN, ZrN, and HfN, metal silicon nitrides such as TaSiN, TiSiN, ZrSiN, and HfSiN, and insulating materials such as amorphous hydrogenated silicon (a-Si:H), SiO2, Si3N4, SiOxNy, SiCOH compounds, SiDLC, and other silicon-containing materials. Resist layer 18 patterned with a wiring level pattern is then formed on the structure of FIG. 4A. If resist layer 18 must be reworked, liner 46 will protect dielectric 12 from damage during processing.

Figure 4C:
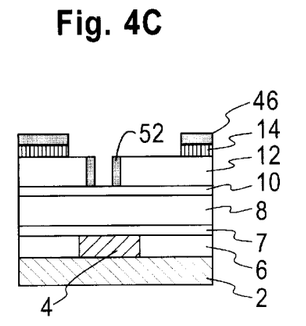
Figure 4D:
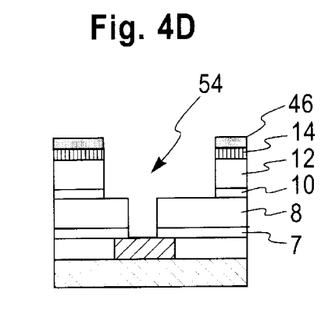

If alignment of resist layer 18 with the via level pattern is satisfactory, the wiring level pattern is then transferred into disposable liner 46, hard mask 14, and etch stop 10 to form the structure of FIG. 4C which is shown with the disposable liner sidewalls 52 which may sometimes be left after disposable liner 46 patterning. The wiring pattern of hard mask 14 is then transferred into dielectric layers 12 and 10 while the via pattern in dielectrics 12 and 10 is transferred into dielectrics 8 and 7. If sidewall liner 52 is still present after these etching steps, it is removed by a selective etching process such as RIE or wet etching to produce the structure of FIG. 4D containing cavity 54 which would then be overfilled with conductive material 22 and planarized as shown in FIGS. 1K and 1L.

Figure 4E:
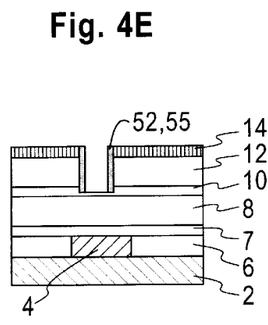

A satisfactory approximation to the structure of FIG. 4C may be formed from the structure of FIG. 1F by etching exposed etch stop 10 in such a manner as to redeposit etch stop material to form sidewall liners 52, as illustrated in FIG. 4E. A preferred resputtering process to form sidewall liners 52 would be ion beam sputtering or low pressure, high bias voltage RIE.

Figure 4F:
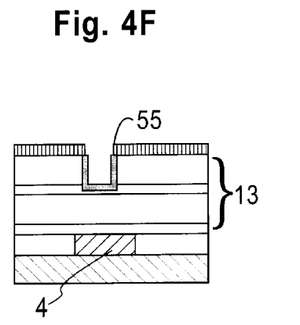

Alternatively, the structures of FIGS. 4E and 4F might be formed by the selective deposition of a liner material 55 on the sidewalls of dielectric 12 or on both the sidewalls of dielectric 12 and the exposed top surface of dielectric 8. Selectively deposited liner material 55 might be deposited by selective chemical vapor deposition, or by a surface modification treatment which could, for example, selectively add Si or SiOx functionality to exposed surfaces of an organic dielectric not containing Si.

Dual pattern hard masks may comprise a first layer of a first material with a first pattern and a second layer of a second material with a second pattern. While materials of said first and second mask layers may be the same (and deposited as a single layer), they are preferably different. More generally, a dual pattern hard mask may comprise a first set of one or more layers with a first pattern, and a second set of one or more layers with a second pattern, materials of said first and second sets of layers selected respectively from a first group of materials and a second group of materials.

FIGS. 5A–5E show a first preferred embodiment of a method for forming a dual pattern hard mask comprising a first layer of a first material with a first pattern, and a second layer of a second material with a second pattern; FIGS. 5F–5H show how this dual pattern hard mask may be used to fabricate a dual relief cavity for use in a Dual Damascene process. For purposes of illustration, one of said first and second patterns will be a via level pattern, and the other of said first and second patterns will be a wiring level pattern. However, this combination of via and wiring level patterns should be viewed as a special case of the general category of dual relief patterns in which all features of a smaller area (via) pattern substantially overlap with the features of a larger area (wiring) pattern.

Figure 5A:
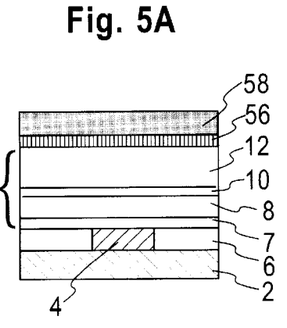
FIGS. 5A–5H illustrate in cross section view a Dual Damascene process flow utilizing a first preferred embodiment of the disclosed dual pattern hard mask.
Figure 5B:
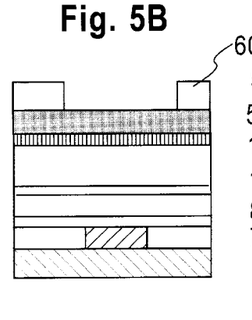

FIG. 5A shows the structure of FIG. 1B after application of lower hard mask layer 56 and upper hard mask layer 58. Hard mask layers 56 and 58 are preferably formed from different materials which have different etch properties from each other and from the dielectric underlayers 12 and 8. For example, lower hard mask layer 56 might be formed from Si3N4 and upper hard mask layer 58 might be formed from SiO2. Other suitable hard mask materials may include SiO2-based materials, other oxides, nitrides other than Si3N4, carbon-based dielectrics, SiC-based dielectrics, polycrystalline silicon, amorphous hydrogenated silicon, and metals. A first resist layer 60, patterned with a first (wiring level) pattern, is formed on layer 58 to form the structure of FIG. 5B. If resist layer 60 is misaligned, rework at this stage presents no problem. The pattern of resist layer 60 is transferred into upper hard mask layer 58 by an etching process to form the structure of FIG. 5C. The etching process is preferably selective, for example a selective SiO2 to Si3N4 etch, so that lower hard mask layer 56 will remain intact during any overetching of hard mask layer 58.

Figure 5C:
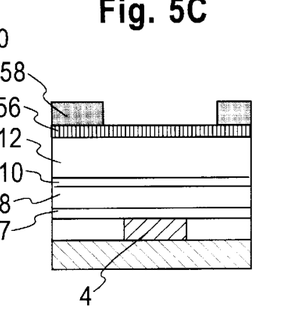
Figure 5D:
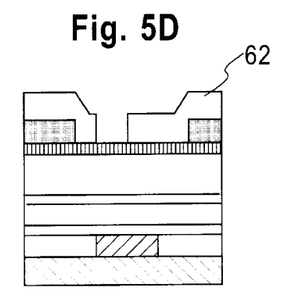
Figure 5E:
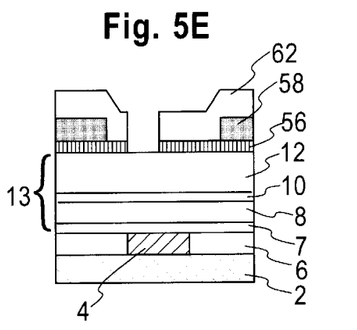
Figure 5F:
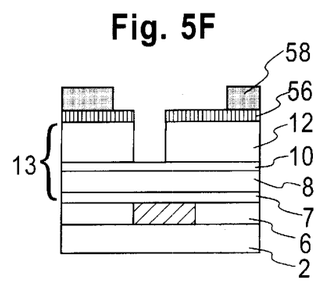
Figure 5G:
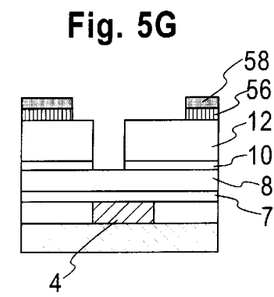
Figure 5H:
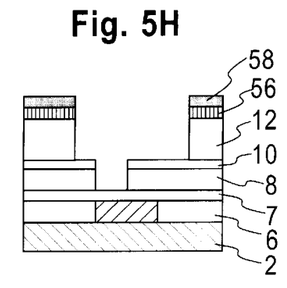

Patterned resist layer 60 is then removed by a process such as ashing or wet chemical etching, and a second resist layer 62, patterned with a second (via level) pattern, is then formed on the structure of FIG. 5C to produce the structure of FIG. 5D. Again, resist rework at this stage presents no problem because lower hard mask layer 56 is still in place to protect dielectric 12. The pattern of resist layer 62 is then transferred into lower hard mask layer 56. FIG. 5E shows the completed dual pattern hard mask, comprising patterned hard mask layers 56 and 58, with patterned resist layer 62 still in place.

The via level pattern is then transferred into dielectric 12 by an etching process such as reactive ion etching, to produce the structure of FIG. 5F. Patterned second resist layer 62 is absent from FIG. 5F because it is typically removed by the etching process used to pattern dielectric 12. The etching conditions are then changed to removed exposed portions of lower hard mask layer 56 and optional etch stop 10, to form the structure of FIG. 5G. Dielectrics 8 and 12 are then etched to transfer said second pattern into the entire thickness of dielectric 12, and said first pattern into the entire thickness of dielectric 8, as shown in FIG. 5H. The cavity structure may then be completed as shown in FIG. 1J, and, for interconnect applications, filled with wiring material 22 as shown in FIGS. 1K and 1L.

FIGS. 6A–6F show a trilayer variation of the FIG. 5 method for forming a dual pattern hard mask; FIGS. 6G–6J show how this dual pattern hard mask may be used to fabricate a dual relief cavity for use in a Dual Damascene process. This trilayer variation may be preferable to the FIG. 5 dual layer dual pattern hard mask because it provides a resist-free dual pattern hard mask prior to any pattern transfer into the substrate. This can be desirable when resist loading is a concern, or if the resist thickness has to be thinned to allow its removal to coincide with the endpoint of the cavity patterning process.

Figure 6A:
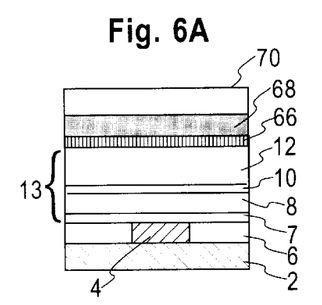
FIGS. 6A–6J illustrate in cross section view a Dual Damascene process flow utilizing a trilayer variation of a first preferred embodiment of the disclosed dual pattern hard mask.

FIG. 6A shows the structure of FIG. 1B after application of lower hard mask layer 66, middle hard mask layer 68, and upper hard mask layer 70. hard mask layers 66, 68, and 70 are preferably formed from materials having different etch properties than dielectric underlayers 12 and 8. Hard mask layers 66 and 70 may be formed from the same material, but preferably one different from that of hard mask layer 68. For example, lower hard mask layer 66 might be formed from a 20 nm thickness of Si3N4, middle hard mask layer 68 might be formed from a 50 nm thickness of SiO2, and upper hard mask layer 70 might be formed from a 40 nm thickness of Si3N4. Other suitable hard mask materials may include SiO2-based materials, other oxides, nitrides other than Si3N4, carbon-based dielectrics, SiC-based dielectrics, polycrystalline silicon, amorphous hydrogenated silicon, and metals.

Figure 6B:
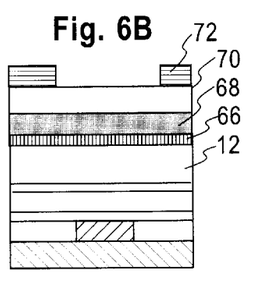

A first resist layer 72, patterned with a first (wiring level) pattern, is formed on layer 70 to form the structure of FIG. 6B. If resist layer 72 is misaligned, rework at this stage presents no problem. The pattern of resist layer 72 is transferred into upper hard mask layer 70 by an etching process. Said etching process might preferably be selective with respect to hard mask layer 68, but it may be nonselective as well. Patterned resist layer 72 is then removed by a process such as ashing or wet chemical etching to form the structure of FIG. 6C.

Figure 6C:
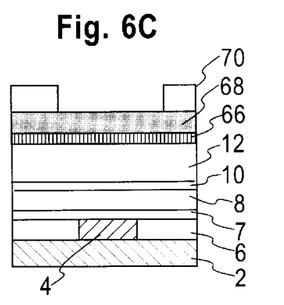
Figure 6D:
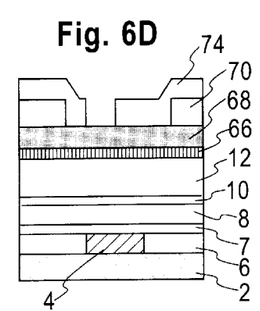
Figure 6E:
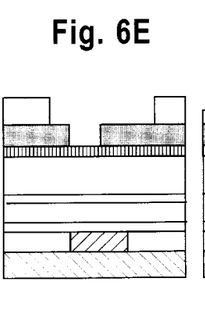

A second resist layer 74, patterned with a second (via level) pattern, is then formed on the structure of FIG. 6C to produce the structure of FIG. 6D. Again, resist rework at this stage presents no problem. The pattern of resist layer 74 is then transferred into middle hard mask layer 68 by an etching process. Said etching process is preferably selective with respect to hard mask layer 66, for example, a selective oxide to nitride etch for the preferred hard mask layer materials cited above. Patterned resist layer 74 is then preferably removed by a process such as ashing or wet chemical etching to form the structure of FIG. 6E. The via pattern of patterned hard mask layer 68 is then transferred to bottom hard mask layer 66 by an etching process that may be selective or nonselective to produce the completed, resist-free trilayer dual pattern hard mask of FIG. 6F, comprising patterned hard mask layers 66, 68, and 70.

Figure 6F:
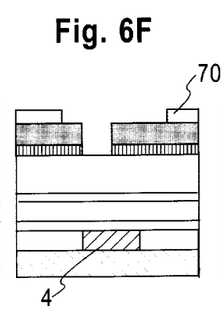
Figure 6G:
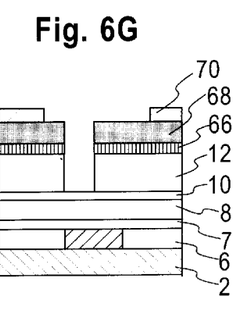
Figure 6H:
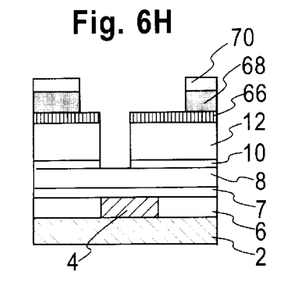
Figure 6I:
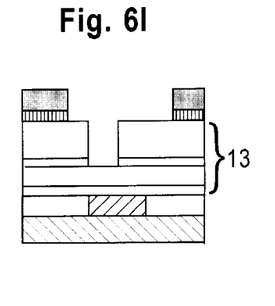
Figure 6J:
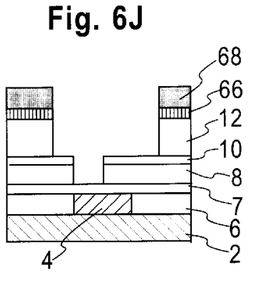

The via level pattern is then transferred into dielectric 12 by an etching process such as reactive ion etching, to produce the structure of FIG. 6G. The etching conditions are then changed to removed exposed portions of middle hard mask layer 68 and optional etch stop 10, to form the structure of FIG. 6H with wiring level pattern contained in middle and top hard mask layers 68 and 70. The wiring level pattern is then transferred into bottom hard mask layer 66 by an etching process that would typically also remove the exposed portions of hard mask 70, to produce the structure of FIG. 6I. Dielectrics 8 and 12 are then etched to transfer said second (wiring level) pattern into the entire thickness of dielectric 12, and said first (via level) pattern into the entire thickness of dielectric 8, as shown in FIG. 6J. The cavity structure may then be completed as shown in FIG. 1J, and, for interconnect applications, filled with wiring material as shown in FIGS. 1K to 1L.

FIGS. 7A–7E show a second preferred embodiment of a method for forming a dual pattern hard mask comprising a first layer of a first material with a first pattern, and a second layer of a second material with a second pattern; and FIGS. 7F–7I show how this dual pattern hard mask may be used to fabricate a dual relief cavity for use in a Dual Damascene process. The main difference between the second embodiment of FIGS. 7A–7I and the first embodiment of FIGS. 5A–5H is the order in which the via and wiring level patterns are transferred into the two layers of the dual pattern hard mask.

Figure 7A:
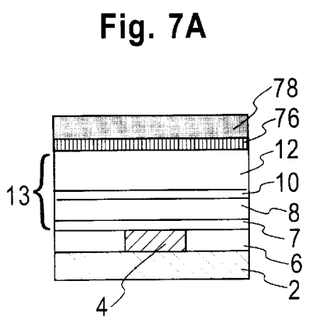
FIGS. 7A–7I illustrate in cross section view a Dual Damascene process flow utilizing a second preferred embodiment of the disclosed dual pattern hard mask.
Figure 7B:
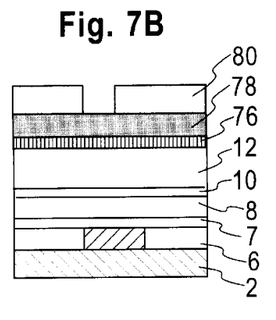

FIG. 7A shows the structure of FIG. 1B after application of lower hard mask layer 76 and upper hard mask layer 78. Hard mask layers 76 and 78 are preferably formed from different materials which have different etch properties from each other and from the dielectric underlayers 12 and 8. For example, lower hard mask layer 76 might be formed from Si3N4 and upper hard mask layer 78 might be formed from SiO2. A first resist layer 80, patterned with a via level pattern, is formed on layer 78 to form the structure of FIG. 7B. If resist layer 80 is misaligned, rework at this stage presents no problem. The pattern of resist layer 80 is transferred into upper hard mask layer 78 by an etching process to form the structure of FIG. 7C. Said etching process is preferably selective, for example a selective SiO2 to Si3N4 etch, to insure that lower hard mask layer 76 will remain intact during any overetching of hard mask layer 78.

Figure 7C:
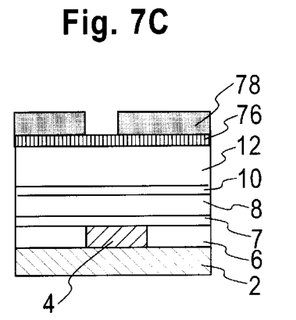
Figure 7D:
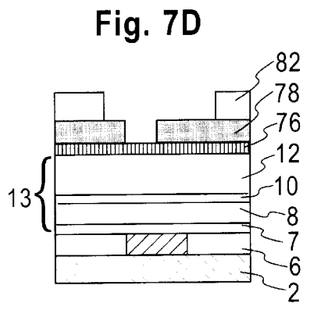
Figure 7E:
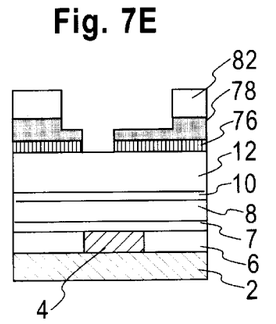
Figure 7F:
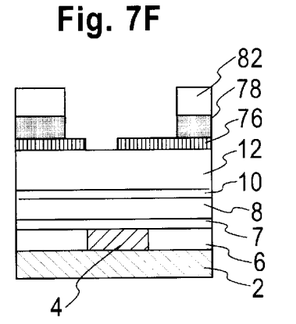

Patterned resist layer 80 is then removed by a process such as ashing or wet chemical etching and a second resist layer 82, patterned with a wiring level pattern, is then formed on the structure of FIG. 7C to produce the structure of FIG. 7D. Again, resist rework at this stage presents no problem because lower hard mask layer 76 is still in place to protect dielectric 12. The wiring pattern of resist layer 82 is then at least partially transferred into upper hard mask layer 78 while simultaneously transferring the via pattern in upper mask layer 78 to lower hard mask layer 76, to form the structure of FIG. 7E. The etching process is preferably accomplished by a nonselective oxide/nitride etch. The wiring pattern is then transferred into the entire thickness of upper hard mask layer 78 by an etching process. Again, the etch of upper hard mask layer is preferably selective with respect to the lower hard mask layer, to insure that lower hard mask layer 76 will remain intact during any overetching of hard mask layer 78. FIG. 7F shows the completed dual pattern hard mask, comprising patterned hard mask layers 76 and 78, with patterned resist layer 82 still in place.

Figure 7G:
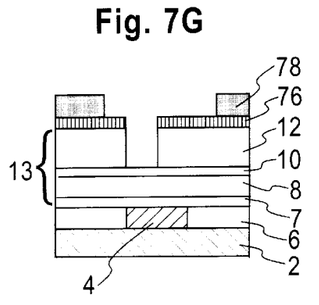
Figure 7H:
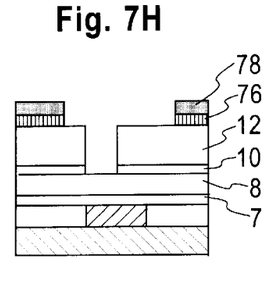
Figure 7I:
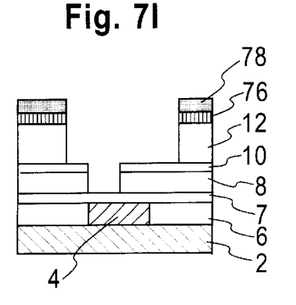

The via level pattern is then transferred into dielectric 12 by an etching process such as reactive ion etching, to form the structure of FIG. 7G. Patterned second resist layer 82 is absent from FIG. 7G because it is typically removed by the etching process used to pattern dielectric 12. The etching conditions are then changed to removed exposed portions of lower hard mask layer 76 and optional etch stop 10, to form the structure of FIG. 7H. Dielectrics 8 and 12 are then etched to transfer the second pattern into the entire thickness of dielectric 12, and the first pattern into the entire thickness of dielectric 8, as shown in FIG. 7I. The cavity structure may then be completed as shown in FIG. 1J, and, for interconnect applications, may be filled with wiring material 22 as shown in FIGS. 1K to 1L.

Figure 8A:
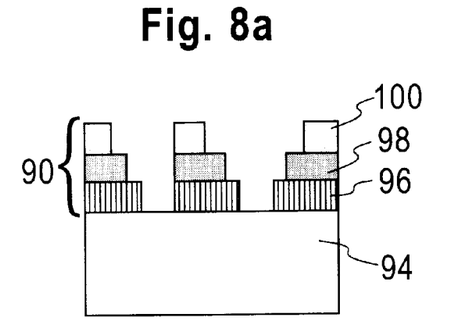
Figure 8B:
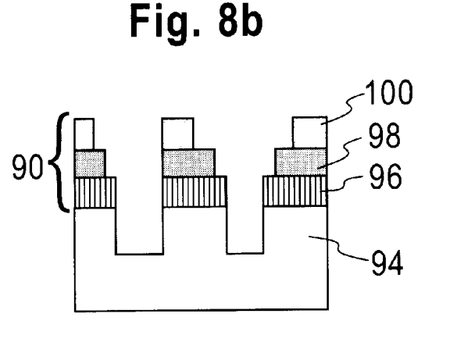
Figure 8D:
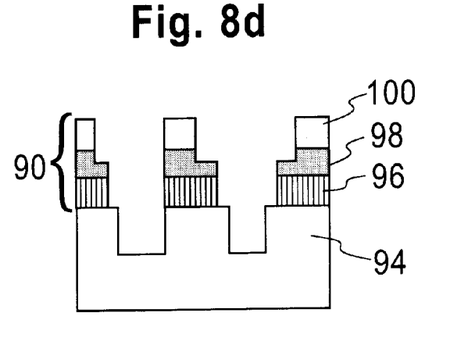

It should be noted that the dual pattern hard masks of FIGS. 6F and 7F are actually special cases of multiple pattern hard masks comprising two or more overlaid patterns. FIG. 8A shows an example of a three pattern hard mask 90 on patternable substrate 94. Three pattern mask 90 comprises a first layer 96 with a first pattern, a second layer 98 with a second pattern, and a third layer 100 with a third pattern. The patterned hard mask layers 96, 98, and 100 are preferably formed from different materials that may be selectively etched with respect to one another. Such a materials choice allows controlled removal of each patterned mask layer after its pattern has been transferred to the substrate. This is illustrated in FIGS. 8B–8D, starting with FIG. 8B which shows three pattern mask 90 after the pattern of layer 96 has been transferred to the substrate, but before the exposed portion of hard mask layer 96 has been removed to allow transfer of the next hard mask layer pattern 98 into the substrate. When hard mask layer 96 is selectively etchable with respect to hard mask layers 98 and 100, hard mask layers 98 and 100 retain their original thicknesses when exposed portions of hard mask layer 96 are removed, as shown in FIG. 8C. However, when hard mask layer 96 is not selectively etchable with respect to hard mask layers 98 and 100, hard mask layers 98 and 100 may be substantially thinned when exposed portions of hard mask layer 96 are removed, as shown in FIG. 8D. This may be tolerable with careful selection of the individual hard mask layer thicknesses, but it makes process control more difficult. SiO2, Si3N4, and polycrystalline silicon comprise one set of three selectively etchable materials that might be suitable for patterned hard mask layers 96, 98, and 100.

While there has been described and illustrated a "twice patterned single mask layer" Dual Damascene process, and two embodiments of a process for forming a dual pattern hard mask comprising a first set of one or more layers with a first pattern, and a second set of one or more layers with a second pattern, it will be apparent to those skilled in the art that further modifications and variations are possible without deviating from the broad scope of the invention which shall be limited solely by the scope of the claims appended hereto.

Having thus described our invention, what we claim as new and desire to secure by Letters Patent is:

1. A method for forming an interconnect structure on the upper surface of a substrate having conductive regions comprising the steps of:

forming over said substrate a first dielectric layer having a thickness corresponding to the thickness of an interconnect via, forming over said first dielectric layer a second dielectric layer having a thickness corresponding to the thickness of an interconnect wiring layer, forming a first hard mask layer over said second layer, forming a layer of resist over said first hard mask layer, patterning said layer of resist with a wiring pattern, patterning said first hard mask layer using said wiring-patterned layer of resist as a mask, transferring said wiring pattern into said second dielectric layer to form wiring cavities corresponding to said wiring pattern, while concurrently removing said wiring-patterned layer of resist, forming a third layer of liner material over said first hard mask layer and on the sidewalls and bottom of said wiring cavities, forming a layer of resist over said third layer, patterning said layer of resist with a via pattern, patterning said third layer using said via-patterned layer of resist as a mask, transferring said via pattern into said first dielectric layer to form via cavities corresponding to said via pattern, and filling said wiring and via cavities with conductive material to make electrical contact to said conductive regions and to form said vias and said wiring pattern.

2. The method of claim 1 wherein said step of forming said third layer of liner material includes the step of forming with conductive material.

3. The method of claim 1 wherein said step of forming said third layer of liner material includes the step of forming with conductive material selected from the group consisting of the metals W, Ta, and Cr, metal nitrides including WN, TaN, TiN, ZrN, and HfN, and metal silicon nitrides including TaSiN, TiSiN, ZrSiN, and HfSiN.

4. The method of claim 1 wherein said step of forming said third layer of liner material includes the step of forming with a nonconductive material not readily etched in oxygen.

5. The method of claim 1 wherein said step of forming said third layer of liner material includes the step of forming with a nonconductive material selected from the group consisting of amorphous hydrogenated silicon (a-Si:H), SiO2, Si3N4, SiOxNy, SiCOH compounds, and SiDLC.

6. The method of claim 1 wherein said step of forming said first dielectric layer includes the step of forming a layer of material selected from the group consisting of diamond-like carbon, fluorinated diamond-like carbon, SiCO, SiCOH compounds, and polymer dielectrics.

7. The method of claim 1 further including the step of forming a fourth dielectric layer over said first dielectric layer and below said second dielectric layer, and the step of patterning said fourth dielectric layer, said fourth dielectric layer functioning as an etch stop layer, said step of forming said fourth dielectric layer including the step of forming with a layer of material selected from the group consisting of SiO2, Si3N4, SiOxNy, SiCOH compounds, silicon-containing DLC (SiDLC), and other silicon-containing materials.

8. The method of claim 1 wherein said step of forming said second dielectric layer includes the step of forming a layer of material selected from the group consisting of diamond-like carbon, fluorinated diamond-like carbon, SiCO and SiCOH compounds, polymer dielectrics.

9. The method of claim 1 wherein said steps of forming said first and second dielectric layers include the step of forming said first and second dielectric layers at the same time.

10. The method of claim 1, after said step of patterning said layer of resist with a via pattern, further including the steps of inspecting the alignment of said via pattern in said resist with respect to said wiring cavities, removing said via patterned resist at times said alignment of said via pattern is misaligned, reforming a layer of resist over said third layer, and repatterning said layer of resist with said via pattern.

11. The method of claim 10, including repeating again the steps of inspecting, removing, reforming and repatterning.

12. The method of claim 1, further including the step of at least partially removing said patterned third layer of liner material after said step of transferring said via pattern into said first dielectric layer.

13. The method of claim 12 wherein said step of removing is selected from the group consisting of CMP, RIE, and wet etching.

14. The method of claim 7 further including the step of transferring said wiring pattern into said fourth dielectric layer, said step of transferring performed at a time after said step of transferring said wiring pattern into said second dielectric layer and before said step of filling said cavities with conductive material.

15. A method for forming an interconnect structure on the upper surface of a substrate having conductive regions comprising the steps of:

forming over said substrate a first dielectric layer having a thickness corresponding to the thickness of an interconnect via, forming over said first dielectric layer a second dielectric layer having a thickness corresponding to the thickness of an interconnect wiring layer, forming a first hard mask layer over said second layer, forming a layer of resist over said first hard mask layer, patterning said layer of resist with a via pattern, patterning said first hard mask layer using said via-patterned layer of resist as a mask, transferring said via pattern into said second dielectric layer to form via cavities corresponding to said via pattern, while concurrently removing said via-patterned layer of resist, forming a third layer of liner material over said first hard mask layer and on the sidewalls and bottom of said via cavities, forming a layer of resist over said third layer, patterning said layer of resist with a wiring pattern, patterning said third layer and said first hard mask layer using said wiring-patterned layer of resist as a mask, transferring, at least partially concurrently, said wiring pattern into said second dielectric layer to form wiring cavities corresponding to said wiring pattern, and said via pattern into said first dielectric layer to form via cavities corresponding to said via pattern, while concurrently removing said wiring-patterned layer of resist, filling said cavities with conductive material to make electrical contact to said conductive regions and to form said vias and said wiring pattern.

16. The method of claim 15 wherein said step of forming said third layer of liner material includes the step of forming with a conductive material not readily etched in oxygen.

17. The method of claim 15 wherein said step of forming said third layer of liner material includes the step of forming with a conductive material selected from the group consisting of the metals including W, Ta, Cr, metal nitrides including WN, TaN, TiN, ZrN, and HfN, and metal silicon nitrides including TaSiN, TiSiN, ZrSiN, and HfSiN.

18. The method of claim 15 wherein said step of forming said third layer of liner material includes the step of forming with nonconductive material.

19. The method of claim 15 wherein said step of forming said third layer of liner material includes the step of forming with a nonconductive material selected from the group consisting of amorphous hydrogenated silicon (a-Si:H), SiO2, Si3N4, SiOxNy, SiDLC, SiCOH compounds, and other silicon-containing materials.

20. The method of claim 15 wherein said step of forming said first dielectric layer includes the step of forming a layer of material selected from the group consisting of diamond-like carbon, fluorinated diamond-like carbon, SiCO and SiCOH compounds, and polymer dielectrics.

21. The method of claim 15 further including the step of forming a fourth dielectric layer over said first dielectric layer and below said second dielectric layer, and the step of patterning said fourth dielectric layer, said fourth dielectric layer functioning as an etch stop layer, said step of forming said fourth dielectric layer including the step of forming a layer of material selected from the group consisting of SiO2, Si3N4, SiOxNy, SiCOH compounds, silicon-containing DLC (SiDLC), and other silicon-containing materials.

22. The method of claim 15 wherein said steps of forming said first and second dielectric layers are replaced by a single step of forming said first and second dielectric layers at the same time.

23. The method of claim 15 wherein said step of forming said second dielectric layer includes the step of forming a layer of material selected from the group consisting of diamond-like carbon, fluorinated diamond-like carbon, SiCO and SiCOH compounds, and polymer dielectrics.

24. The method of claim 15, after said step of patterning said layer of resist with a wiring pattern, further including the steps of inspecting the alignment of said wiring pattern in said resist with respect to said via cavities, removing said wiring patterned resist at times said alignment of said wiring pattern is misaligned, reforming a layer of resist over said third layer, and repatterning said layer of resist with said wiring pattern.

25. The method of claim 24, further including repeating said steps of inspecting, removing, reforming and repatterning.

26. The method of claim 15 further including the step of removing said patterned third layer after said step of transferring said via pattern into said first dielectric layer.

27. The method of claim 26 wherein said step of removing is selected from the group consisting of RIE and wet etching.

28. A method for forming an interconnect structure on the upper surface of a substrate having conductive regions comprising the steps of:
   forming over said substrate a first dielectric layer having a thickness corresponding to the thickness of an interconnect via,
   forming over said first dielectric layer a second dielectric layer having a thickness corresponding to the thickness of an interconnect wiring layer,
   forming a first hard mask layer over said second layer,
   forming a second hard mask layer over said first hard mask layer, said second hard mask layer preferably formed of a material different from said first hard mask to permit selective etching of said second hard mask layer with respect to said first hard mask layer,
   forming a first layer of resist over said second hard mask layer,
   patterning said first layer of resist with a wiring pattern,
   patterning said second hard mask layer using said wiring-patterned first layer of resist as a mask,
   removing said wiring-patterned first layer of resist,
   forming a second layer of resist over said first and second hard mask layer,
   patterning said second layer of resist with a via pattern,
   patterning said first hard mask layer using said via-patterned second layer of resist as a mask,
   transferring said via pattern in said patterned first hard mask layer into said second dielectric layer, while concurrently removing said via-patterned second layer of resist, and
   patterning said via-patterned first hard mask layer using said wiring-patterned second hard mask layer as a mask,
   transferring, at least partially concurrently, said via pattern into said first dielectric layer to form via cavities corresponding to said via pattern, and said wiring pattern into said second dielectric layer to form wiring cavities corresponding to said wiring pattern, and
   filling said cavities with conductive material to make electrical contact with said conductive regions and to form said vias and said wiring pattern.

29. The method of claim 28 wherein said step of forming said first dielectric layer includes the step of forming a layer of material selected from the group consisting of diamond-like carbon, fluorinated diamond-like carbon, SiCO and SiCOH compounds, and polymer dielectrics.

30. The method of claim 28 further including the step of forming a third dielectric layer over said first dielectric layer and below said second dielectric layer, and the step of patterning said third dielectric layer, said third dielectric layer functioning as an etch stop layer, said step of forming said third dielectric layer including the step of forming a layer of material selected from the group consisting of SiO2, Si3N4, SiOxNy, SiCOH compounds, silicon-containing DLC (SiDLC), and other silicon-containing materials.

31. The method of claim 28 wherein said step of forming said second dielectric layer includes the step of forming with a layer of material selected from the group consisting of diamond-like carbon, fluorinated diamond-like carbon, SiCO and SiCOH compounds, polymer dielectrics.

32. The method of claim 28 wherein said steps of forming said first and second dielectric layers are replaced by a single step of forming said first and second dielectric layers at the same time.

33. The method of claim 28, after said step of patterning said second layer of resist with a via pattern, further including the steps of inspecting the alignment of said via pattern in said resist with respect to said patterned second hard mask layer,
   removing said via patterned second layer of resist at times said alignment of said via pattern is misaligned,
   reforming said second layer of resist over said first and second hard mask layer, and repatterning said second layer of resist with said via pattern.

34. The method of claim 33, further including repeating said steps of inspecting, removing, reforming and repatterning.

35. A method for forming an interconnect structure on the upper surface of a substrate having conductive regions comprising the steps of:
   forming over said substrate a first dielectric layer having a thickness corresponding to the thickness of an interconnect via,
   forming over said first dielectric layer a second dielectric layer having a thickness corresponding to the thickness of an interconnect wiring layer,
   forming a first hard mask layer over said second layer,
   forming a second hard mask layer over said first hard mask layer, said second hard mask layer preferably formed of a material different from said first hard mask to permit selective etching of said second hard mask layer with respect to said first hard mask layer,
   forming a third hard mask layer over said second hard mask layer, said third hard mask layer formed of a material different from said second hard mask to permit selective etching of said third hard mask layer with respect to said second hard mask layer,
   forming a first layer of resist over said third hard mask layer,
   patterning said first layer of resist with a wiring pattern,
   patterning said third hard mask layer using said wiring-patterned first layer of resist as a mask,
   removing said patterned first layer of resist,
   forming a second layer of resist over said second and third hard mask layer,
   patterning said second layer of resist with a via pattern,
   patterning said second hard mask layer using said via-patterned second layer of resist as a mask,
   patterning said first hard mask layer using said via-patterned second hard mask layer as a mask,
   transferring said via pattern in said patterned first hard mask layer into said second dielectric layer while concurrently removing any residuals of said patterned second layer of resist,
   patterning said second hard mask layer using said wiring-patterned third hard mask layer as a mask, patterning said first hard mask layer using said wiring-patterned second hard mask layer as a mask, transferring, at least partially concurrently, said via pattern into said first dielectric layer to form via cavities corresponding to said via pattern, and said wiring pattern into said second layer to form wiring cavities corresponding to said wiring pattern, and filling said cavities with conductive material to make electrical contact with said conductive regions and to form said vias and said wiring pattern.

36. The method of claim 35 wherein said step of forming said first dielectric layer includes the step of forming a layer of material selected from the group consisting of diamond-like carbon, fluorinated diamond-like carbon, SiCO and SiCOH compounds, and polymer dielectrics.

37. The method of claim 35 further including the step of forming a third dielectric layer over said first dielectric layer and below said second dielectric layer, and the step of patterning said third dielectric layer, said third dielectric layer functioning as an etch stop layer, said step of forming said third dielectric layer including the step of forming a layer of material selected from the group of materials consisting of SiO2, Si3N4, SiOxNy, SiCOH compounds, silicon-containing DLC (SiDLC), and other silicon-containing materials.

38. The method of claim 35 wherein said step of forming said second dielectric layer includes the step of forming a layer of material selected from the group consisting of diamond-like carbon, fluorinated diamond-like carbon, SiCO and SiCOH compounds, and polymer dielectrics.

39. The method of claim 35 wherein said steps of forming said first and second dielectric layers are replaced by a single step of forming said first and second dielectric layers at the same time.

40. The method of claim 35, after said step of patterning said second layer of resist with a via pattern, further including the steps of inspecting the alignment of said via pattern in said resist with respect to said patterned third hard mask layer, removing said via patterned second layer of resist at times said alignment of said via pattern is misaligned, reforming said second layer of resist over said second and third hard mask layer, and repatterning said second layer of resist with said via pattern.

41. The method of claim 40, further including repeating said steps of inspecting, removing, reforming and repatterning.

42. A method for forming an interconnect structure on the upper surface of a substrate having conductive regions comprising the steps of:

forming over said substrate a first dielectric layer having a thickness corresponding to the thickness of an interconnect via, forming over said first dielectric layer a second dielectric layer having a thickness corresponding to the thickness of an interconnect wiring layer forming a first hard mask layer over said second dielectric layer, forming a second hard mask layer over said first hard mask layer, said second hard mask layer preferably formed of a material different from said first hard mask to permit selective etching of said second hard mask layer with respect to said first hard mask layer, forming a first layer of resist over said second hard mask layer, patterning said first layer of resist with a via pattern, patterning said second hard mask layer using said via-patterned first layer of resist as a mask, removing said first layer of resist, forming a second layer of resist over said first and second hard mask layer, patterning said second layer of resist with a wiring pattern, patterning said second hard mask layer using said wiring-patterned second layer of resist as a mask while patterning said first hard mask layer using said via-patterned second hard mask layer as a mask, transferring said via pattern in said patterned first hard mask layer into said second dielectric layer, while concurrently removing any residuals of said patterned second layer of resist, transferring, at least partially concurrently, said via pattern into said first dielectric layer to form via cavities corresponding to said via pattern, and said wiring pattern into said second layer to form wiring cavities corresponding to said wiring pattern, filling said cavities with conductive material to make electrical contact with said conductive regions and to form said vias and said wiring pattern.

43. The method of claim 42 wherein said step of forming said first dielectric layer includes the step of forming a layer of material selected from the group consisting of diamond-like carbon, fluorinated diamond-like carbon, SiCO and SiCOH compounds, organic and inorganic polymer dielectrics.

44. The method of claim 42 further including the step of forming a third dielectric layer over said first dielectric layer and below said second dielectric layer, and the step of patterning said third dielectric layer, said third dielectric layer functioning as an etch stop layer, said step of forming said third dielectric layer including the step of forming with a layer of material selected from the group of materials consisting of SiO2, Si3N4, SiOxNy, SiCOH compounds, silicon-containing DLC (SiDLC), and other silicon-containing materials.

45. The method of claim 42 wherein said step of forming said second dielectric layer includes the step of forming a layer of material selected from the group consisting of diamond-like carbon, fluorinated diamond-like carbon, SiCO and SiCOH compounds, and polymer dielectrics.

46. The method of claim 42 wherein said steps of forming said first and second dielectric layers are replaced by a single step of forming said first and second dielectric layers at the same time.

47. The method of claim 42, after said step of patterning said second layer of resist with a wiring pattern, further including the steps of inspecting the alignment of said wiring pattern in said resist with respect to said patterned second hard mask layer, removing said via patterned second layer of resist at times said alignment of said wiring pattern is misaligned, reforming said second layer of resist over said first and second hard mask layer, and repatterning said second layer of resist with said wiring pattern.

48. The method of claim 47, further including repeating said steps of inspecting, removing, reforming and repatterning.

* * * * *